United States Patent
Kim et al.

(10) Patent No.: US 7,459,957 B2
(45) Date of Patent: Dec. 2, 2008

(54) FUSE CIRCUIT WITH LEAKAGE PATH ELIMINATION

(75) Inventors: Min-Soo Kim, Seoul (KR); Kyu-Han Han, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 2 days.

(21) Appl. No.: 11/565,838

(22) Filed: Dec. 1, 2006

(65) Prior Publication Data

US 2007/0139096 A1    Jun. 21, 2007

(30) Foreign Application Priority Data

Dec. 15, 2005    (KR)    ........................ 10-2005-0123987

(51) Int. Cl.
    *H01H 37/76*    (2006.01)
(52) U.S. Cl. ..................................... 327/525; 365/225.7
(58) Field of Classification Search ................. 327/525; 365/225.7
    See application file for complete search history.

(56) References Cited

U.S. PATENT DOCUMENTS

| | | | |
|---|---|---|---|
| 5,115,150 A * | 5/1992 | Ludwig ........................ 326/86 |
| 5,313,424 A * | 5/1994 | Adams et al. ................. 365/200 |
| 5,654,651 A * | 8/1997 | Kaneko et al. ............... 326/121 |
| 5,838,620 A * | 11/1998 | Zagar et al. .................. 365/200 |
| 5,966,333 A * | 10/1999 | Otani et al. .................. 365/200 |
| 5,991,220 A * | 11/1999 | Freyman et al. ........... 365/225.7 |
| 6,052,313 A * | 4/2000 | Atsumi et al. ........... 365/189.05 |
| 6,215,336 B1 | 4/2001 | Ohashi ......................... 327/77 |
| 6,320,802 B1 * | 11/2001 | Ohbayashi ................... 365/200 |
| 6,330,204 B1 * | 12/2001 | Miyagi ..................... 365/225.7 |
| 6,373,760 B1 | 4/2002 | Ohbayashi ................... 365/200 |
| 6,400,208 B1 * | 6/2002 | Lesher et al. ................ 327/525 |
| 6,426,911 B1 * | 7/2002 | Lehmann et al. ......... 365/225.7 |
| 6,489,832 B1 * | 12/2002 | Kim et al. .................... 327/525 |
| 6,498,526 B2 * | 12/2002 | Lim et al. .................... 327/525 |
| 6,566,937 B1 * | 5/2003 | Mori et al. ................... 327/525 |
| 6,680,873 B2 * | 1/2004 | Muraoka et al. ......... 365/225.7 |
| 6,700,817 B2 * | 3/2004 | Atsumi et al. .......... 365/185.09 |
| 6,724,238 B2 * | 4/2004 | Derner et al. ................ 327/525 |
| 6,768,695 B2 * | 7/2004 | Kaiser et al. .............. 365/225.7 |
| 6,798,272 B2 * | 9/2004 | Lehmann ..................... 327/525 |
| 6,949,986 B2 | 9/2005 | Tsujino et al. ............... 333/124 |
| 7,009,443 B2 * | 3/2006 | Illegems ...................... 327/525 |
| 7,263,022 B2 * | 8/2007 | Imondi ..................... 365/225.7 |
| 7,276,955 B2 * | 10/2007 | Mohr et al. .................. 327/525 |

* cited by examiner

*Primary Examiner*—Kenneth B. Wells
(74) *Attorney, Agent, or Firm*—Marger Johson & McCollom, P.C.

(57) ABSTRACT

A fuse circuit may include a fuse cut detection unit to output state information indicating whether or not a fuse is cut during a fuse cut detection time period, a maintenance and output unit to maintain the state information and output a fuse state information signal, and a connection/disconnection unit to connect the fuse cut detection unit to the maintenance and output unit during the fuse cut detection time period and disconnect the fuse cut detection unit from the maintenance and output unit after the fuse cut detection time period. A fuse circuit may recognize an indefinite voltage at a detection node caused by a leakage path through a fuse as a predetermined fuse state.

23 Claims, 5 Drawing Sheets

FUSE CIRCUIT WITH LEAKAGE PATH ELIMINATION

CROSS-REFERENCE TO RELATED PATENT APPLICATION

This application claims the benefit of Korean Patent Application No. 10-2005-0123987, filed on Dec. 15, 2005, in the Korean Intellectual Property Office, the disclosure of which is incorporated herein in its entirety by reference.

BACKGROUND

1. Field of Invention

The inventive principles of this patent disclosure relate to a semiconductor device, and more particularly, to a fuse circuit used in a semiconductor device.

2. Description of the Related Art

Fuse circuits are connected to other circuits in semiconductor devices to indicate whether the other circuits are usable. For example, if a fuse in a fuse circuit is cut, it indicates that a predetermined circuit connected to the fuse circuit is capable of operating. On the other hand, if the fuse is not cut, it indicates that the predetermined circuit is not capable of operating. An example of this type of fuse circuit is disclosed in U.S. Pat. No. 6,215,336.

Figure 1:
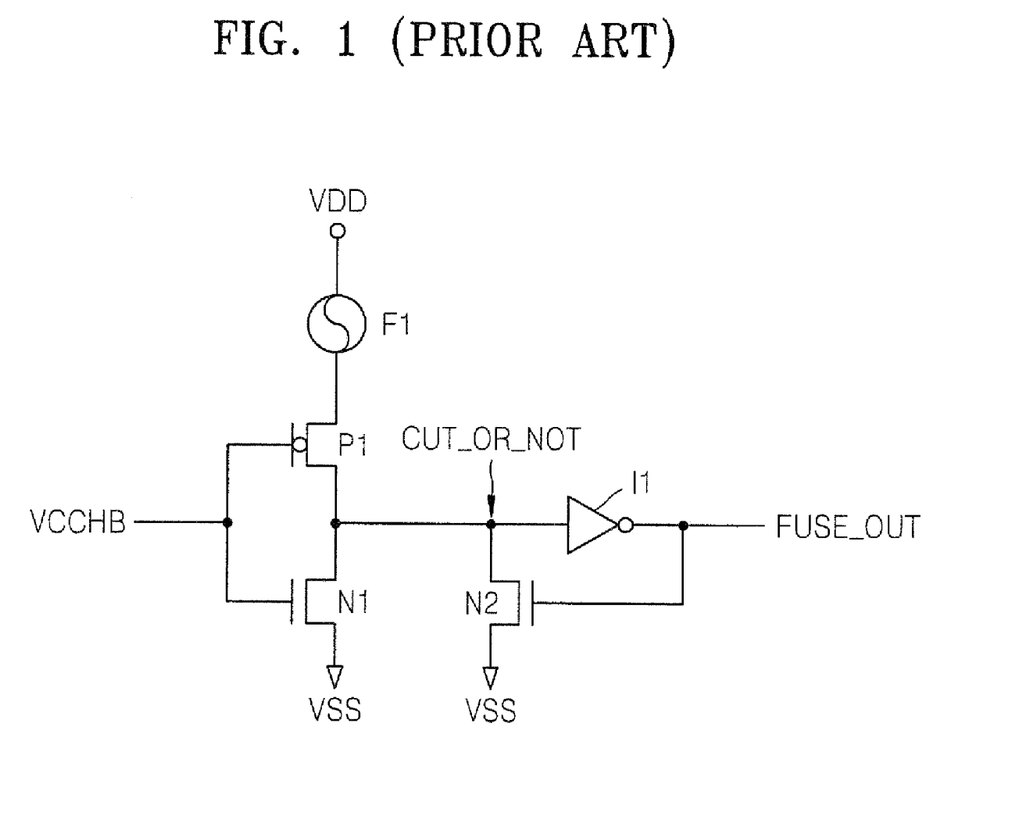
FIG. 1 is a circuit diagram of a conventional fuse circuit.
Figure 2A:
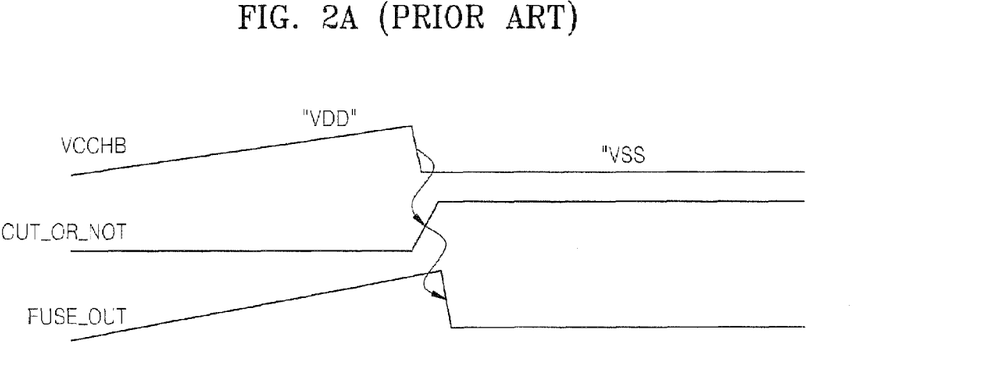
FIG. 2A is a diagram illustrating waveforms of signals input to and/or output from the conventional fuse circuit illustrated in FIG. 1 when a fuse in the conventional fuse circuit is not cut.
Figure 2B:
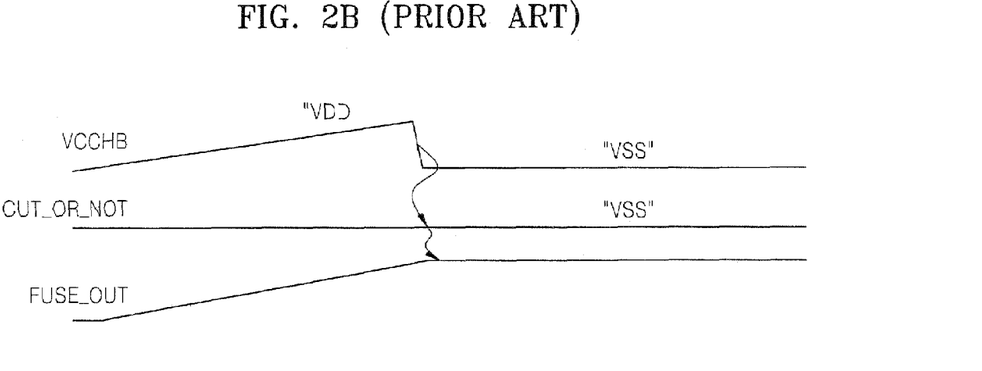
FIG. 2B is a diagram illustrating waveforms of the signals input to and/or output from the conventional fuse circuit illustrated in FIG. 1 when the fuse in the conventional fuse circuit is cut.
Figure 2C:
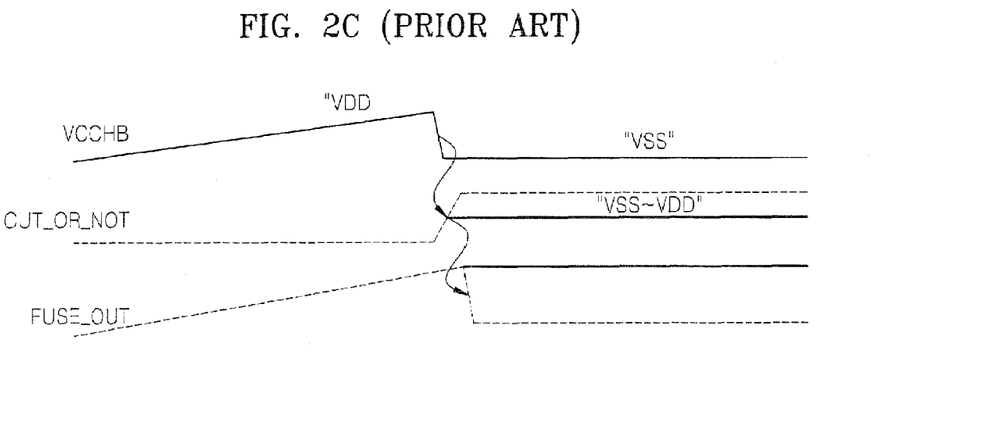
FIG. 2C is a diagram illustrating waveforms of the signals input to and/or output from the conventional fuse circuit illustrated in FIG. 1 when a leakage current path exists through the fuse in the conventional fuse circuit.

FIG. 1 is a circuit diagram of a conventional fuse circuit, FIG. 2A is a diagram illustrating the waveforms of signals input to and/or output from the conventional fuse circuit illustrated in FIG. 1 when a fuse F1 is not cut, FIG. 2B is a diagram illustrating the waveforms of the signals input to and/or output from the conventional fuse circuit illustrated in FIG. 1 when the fuse F1 is cut, and FIG. 2C is a diagram illustrating the waveforms of the signals input to and/or output from the conventional fuse circuit illustrated in FIG. 1 when a leakage current path exists through the fuse F1 due to resistance components left by a cutting operation.

Referring to FIGS. 1 through 2C, when the conventional fuse circuit is powered up, a control signal VCCHB ramps up to a predetermined voltage by following a power supply voltage VDD. Once the control signal VCCHB reaches the predetermined voltage, the voltage of the control signal VCCHB is driven as low as a ground voltage VSS.

An operation of the conventional fuse circuit illustrated in FIG. 1 will now be described in detail. When the control signal VCCHB exceeds a threshold voltage of an NMOS transistor N1 by following the power supply voltage VDD, the NMOS transistor N1 is turned on, and a node CUT_OR_NOT is driven to the ground voltage VSS. When the node CUT_OR_NOT is at the ground voltage VSS, a fuse state information signal FUSE_OUT is driven to the power supply voltage VDD. Then, the fuse state information signal FUSE_OUT turns on an NMOS transistor N2, thereby maintaining the voltage of the node CUT_OR_NOT at the ground voltage VSS.

When the control signal VCCHB reaches the predetermined voltage while following the power supply voltage VDD and then drops to the ground voltage VSS, the NMOS transistor N1 is turned off, and a PMOS transistor P1 is turned on. At this time, if the fuse F1 is not cut as illustrated in FIG. 2A, the voltage of the node CUT_OR_NOT is driven as high as the power supply voltage VDD due to the fuse F1 and the PMOS transistor P1. Accordingly, the voltage of the fuse state information signal FUSE_OUT is driven as high as the ground voltage VSS. When the fuse state information signal FUSE_OUT is at the ground voltage VSS, it indicates that the fuse F1 is not cut.

On the other hand, if the fuse F1 is cut as illustrated in FIG. 2B, the voltage of the node CUT_OR_NOT is maintained at the ground voltage VSS even if the PMOS transistor P1 is turned on, and accordingly, the voltage of the fuse state information signal FUSE_OUT is maintained at the power supply voltage VDD. When the fuse state information signal FUSE_OUT is at the power supply voltage VDD, it indicates that the fuse F1 is cut.

However, even when the fuse F1 is cut, residues of the fuse F1 may still remain for various reasons. In this case, due to the fuse residues, resistance components may be generated, thereby forming a leakage current path between the PMOS transistor P1 and the NMOS transistor N2. This causes unnecessary leakage current to flow through the leakage current path. Therefore, the node CUT_OR_NOT may have an indefinite voltage between the ground voltage VSS and the power supply voltage VDD.

SUMMARY

Some of the inventive principles of this patent disclosure relate to a fuse circuit that includes a fuse cut detection unit which comprises a fuse and outputs state information indicating whether or not the fuse is cut during a fuse cut detection time period; a maintenance and output unit which maintains the state information and outputs a fuse state information signal; and a connection/disconnection unit which connects the fuse cut detection unit to the maintenance and output unit during the fuse cut detection time period and disconnects the fuse cut detection unit from the maintenance and output unit after the fuse cut detection time period.

The fuse cut detection unit may include the fuse which has a first terminal connected to a first power supply; a delay circuit which delays a first control signal by as much as the fuse cut detection time period and outputs a second control signal as the delayed result; and a state information output unit which outputs the state information in response to the first control signal and the second control signal.

The state information output unit may include a first MOS transistor which is connected between a second terminal of the fuse and a node through which the state information is output and has a gate to which the first control signal is applied; and a second MOS transistor which is connected between the node through which the state information is output and a second power supply, and has a gate to which the second control signal is applied.

The first control signal may gradually ramp up to a predetermined voltage by following the power supply voltage, and, once the first control signal reaches the predetermined voltage, the voltage of the first control signal may be driven as low as the ground voltage.

The connection/disconnection unit may include a switch which connects the fuse cut detection unit to the maintenance and output unit or disconnects the fuse cut detection unit from the maintenance and output unit in response to the second control signal. The switch may be comprised of a transmission gate. The maintenance and output unit may include a latch circuit which has an input terminal connected to the connection/disconnection unit and an output terminal from which the fuse state information signal is output; and a MOS transistor which is connected between the input terminal of the latch circuit and the second power supply, and has a gate to which the first control signal is applied.

The fuse cut detection unit may include: a delay circuit which delays the first control signal by as much as the fuse cut detection time period and outputs a second control signal as the delayed result; and a state information output unit which comprises a fuse and outputs the state information in response to the first control signal and the second control signal.

The state information output unit may include a fuse; a first MOS transistor which is connected between a first power supply and a first terminal of the fuse, and has a gate to which the first control signal is applied; and a second MOS transistor which is connected between a second terminal of the fuse and a second power supply and has a gate to which the second control signal is applied, wherein the state information is output from a connection node between the second terminal of the fuse and the second MOS transistor.

The first control signal may gradually ramp up to a predetermined voltage by following the power supply voltage, and, once the first control signal reaches the predetermined voltage, the level of the first control signal may be driven as low as the ground voltage.

The connection/disconnection unit may include a switch which connects the fuse cut detection unit to the maintenance and output unit or disconnects the fuse cut detection unit from the maintenance and output unit in response to the second control signal. The switch may be comprised of a transmission gate. The maintenance and output unit may include a latch circuit which has an input terminal connected to the connection/disconnection unit and an output terminal from which the fuse state information signal is output; and a MOS transistor which is connected between the input terminal of the latch circuit and the second power supply and has a gate to which the first control signal is applied.

Some additional inventive principles of this patent disclosure relate to a method of sensing the state of a fuse. The method may include connecting a detection node to a first power supply through a first device, connecting the detection node to a second power supply through the fuse and a second device, detecting a voltage of the detection node, and always recognizing the voltage of the detection node as a predetermined fuse state when the voltage of the detection node is between voltages of the first and second power supply. Detecting the voltage of the detection node may include amplifying the voltage of the detection node. The first and second devices may include first and second transistors having substantially different sizes.

DETAILED DESCRIPTION

The inventive principles will now be described more fully with reference to the accompanying drawings in which exemplary embodiments of the invention are shown. In the drawings, like reference numerals represent like elements.

Figure 3:
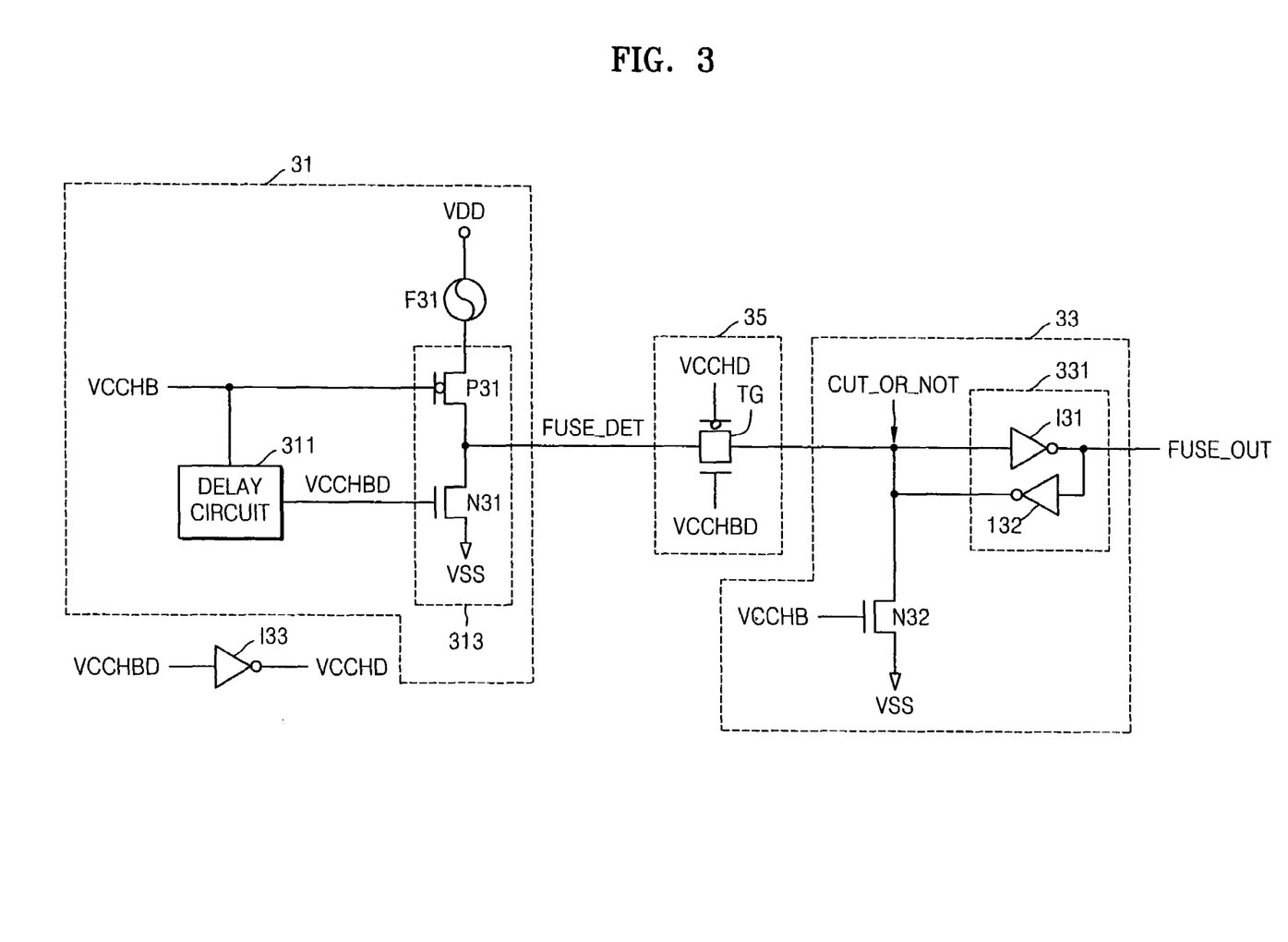
FIG. 3 is a circuit diagram of an embodiment of a fuse circuit according to some of the inventive principles of this patent disclosure.

FIG. 3 is a circuit diagram of an embodiment of a fuse circuit according to some of the inventive principles of this patent disclosure. Referring to FIG. 3, the fuse circuit includes a fuse cut detection unit 31, a maintenance and output unit 33, and a connection/disconnection unit 35.

The fuse cut detection unit 31 includes a fuse F31 and outputs state information FUSE_DET indicating whether the fuse F31 is cut or not during a predetermined fuse cut detection time period. The maintenance and output unit 33 maintains the state information FUSE_DET which is input through the connection/disconnection unit 35 and outputs a fuse state information signal FUSE_OUT.

The connection/disconnection unit 35 connects the fuse cut detection unit 31 to the maintenance and output unit 33 during the predetermined fuse cut detection time period and disconnects the fuse cut detection unit 31 from the maintenance and output unit 33 outside the predetermined fuse cut detection time period.

The fuse cut detection unit 31 includes the fuse F31, a delay circuit 311 and a state information output circuit 313. The fuse F31 has a first terminal connected to a first power supply which provides a power supply voltage VDD. The delay circuit 311 delays a first control signal VCCHB by as much as the predetermined fuse cut detection time period and outputs a second control signal VCCHBD as the delayed result. The state information output circuit 313 outputs the state information signal FUSE_DET in response to the first control signal VCCHB and the second control signal VCCHBD. The predetermined fuse cut detection time period is determined in such a manner as to provide a stable fuse cutting operation.

The state information output circuit 313 includes a PMOS transistor P31 and an NMOS transistor N31. The PMOS transistor P31 is connected between a second terminal of the fuse F31 and a terminal of the state information output circuit 313 through which the state information signal FUSE_DET is output. The NMOS transistor N31 is connected between the terminal of the state information output circuit 313 through which the state information signal FUSE_DET is output and a second power supply providing a ground voltage VSS, and has a gate to which the second control signal VCCHBD is applied.

When the fuse circuit is powered up, the first control signal VCCHB ramps up to a predetermined voltage by following the power supply voltage VDD. Once the first control signal VCCHB reaches the predetermined voltage, the voltage of the first control signal VCCHB is driven as low as the ground voltage VSS.

The connection/disconnection unit 35 includes a switch TG which connects/disconnects the fuse cut detection unit 31 to/from the maintenance and output unit 33 in response to the second signal VCCHBD and the signal VCCHD which is an inverted version of the second signal VCCHBD. The switch TG may be implemented as a transmission gate as illustrated in FIG. 3. An inverter 133 inverts the second control signal VCCHBD and outputs the inverted signal VCCHD as the inverted result.

The maintenance and output unit 33 includes a latch circuit 331 and an NMOS transistor N32. The latch circuit 331 includes inverters 131 and 132 connected between an input node CUT_OR_NOT, which is connected to the connection/disconnection unit 35, and an output node FUSE_OUT through which the fuse state information signal FUSE_OUT is output. The NMOS transistor N32 is connected between the input node CUT_OR_NOT and the ground voltage VSS, and has a gate to which the first control signal VCCHB is applied. The NMOS transistor N32 functions as an initialization circuit.

Figure 4A:
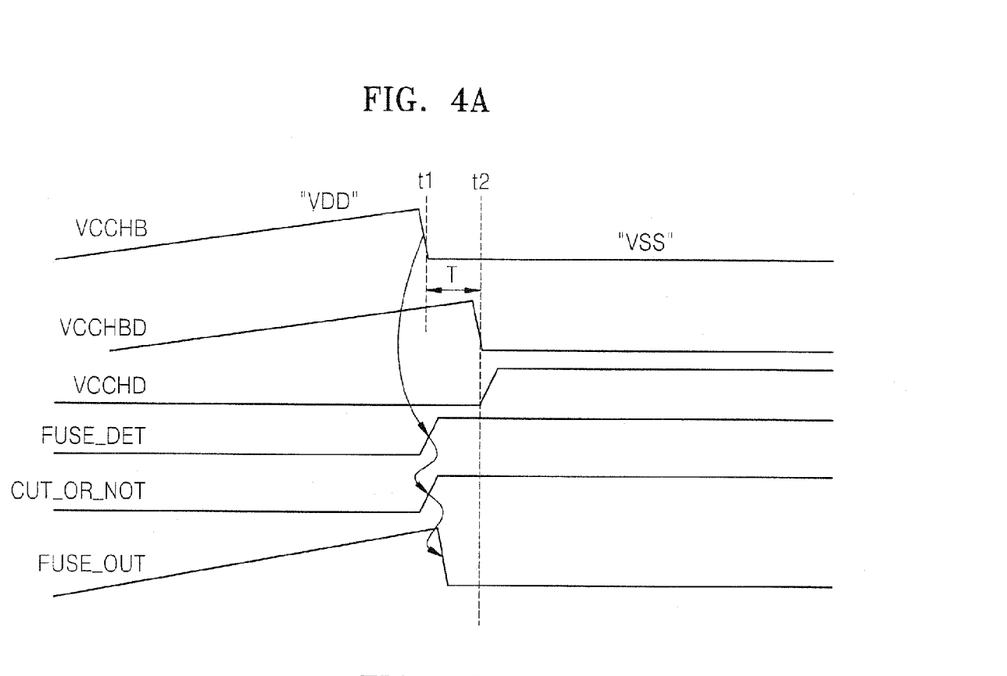
FIG. 4A is a diagram illustrating waveforms of signals input to and/or output from the fuse circuit illustrated in FIG. 3 when a fuse in the fuse circuit is not cut.

FIG. 4A is a diagram illustrating waveforms of signals input to and/or output from the fuse circuit illustrated in FIG. 3 when the fuse F31 is not cut. An operation of the fuse circuit illustrated in FIG. 3 will now be described in detail with reference to FIG. 4A.

Referring to FIG. 4A, when the fuse F31 is not cut, the first control signal VCCHB gradually increases until a predetermined time t1 during an initial power-up time period by following the power supply voltage VDD. Once the first control signal VCCHB reaches a predetermined voltage, the voltage of the first control signal VCCHB is driven as low as the ground voltage VSS. The delay circuit 311 generates the second control signal VCCHBD by delaying the first control signal VCCHB by as much as a fuse cut detection period T. The inverter 133 generates the inverted signal VCCHD by inverting the second control signal VCCHBD.

Before the predetermined time t1, the first control signal VCCHB and the second control signal VCCHBD are both at the power supply voltage VDD. Accordingly, the NMOS transistor N31 is turned on, the state information signal FUSE_DET is driven to the ground voltage VSS, the NMOS transistor N32 is turned on, and the node CUT_OR_NOT is initialized to the ground voltage VSS. Since the voltage of the inverted signal VCCHD is maintained at the ground voltage VSS, the transmission gate TG is turned on, and thus, the node through which the state information signal FUSE_DET is output and the input node CUT_OR_NOT are connected to each other by the transmission gate TG.

During the fuse cut detection time period T after the predetermined time t1, the voltage of the first control signal VCCHB is driven as low as the ground voltage VSS, and the voltage of the second control signal VCCHBD is maintained at the power supply voltage VDD. Therefore, the PMOS transistor P31 and the NMOS transistor N31 are both turned on. Since the size of the NMOS transistor N31 is much smaller than the size of the PMOS transistor P31, the current discharged through the NMOS transistor N31 is much smaller than the current supplied to the state information output circuit 313 through the PMOS transistor P31. Accordingly, when the fuse F31 is not cut, the voltage of the state information signal FUSE_DET increases to the power supply voltage VDD.

Since, during the fuse cut detection time period T after the predetermined time t1, the voltage of the second control signal VCCHBD is maintained at the power supply voltage VDD and the voltage of the first control signal VCCHD is as low as the ground voltage VSS, the transmission gate TG is maintained in a turned-on state. Therefore, the voltage of the input node CUT_OR_NOT is driven as high as the power supply voltage VDD, and the voltage of the fuse state information signal FUSE_OUT is driven as low as the ground voltage VSS. When the voltage of the fuse state information signal FUSE_OUT is at the ground voltage VSS, it indicates that the fuse F31 is not cut.

At a time t2 after the fuse cut detection time period T, the voltage of the second control signal VCCHBD is driven as low as the ground voltage VSS. Then, the NMOS transistor N31 is turned off, and the transmission gate TG is turned off. Accordingly, a current path to the ground voltage VSS does not exist any longer, which means no leakage current flows to the second power supply. At this time, the voltage of the input node CUT_OR_NOT and the voltage of the fuse state information signal FUSE_OUT are maintained at the power supply voltage VDD and the ground voltage VSS, respectively.

When the fuse F31 is cut, the first control signal VCCHB is initially at the ground voltage VSS. Thus, even if the PMOS transistor P31 is turned on, the voltage of the state information signal FUSE_DET is maintained at the power supply voltage VDD because there is no path for increasing the voltage of the node through which the state information signal FUSE_DET is output to the first power supply. The voltage of the input node CUT_OR_NOT and the voltage of the fuse state information signal FUSE_OUT are maintained at the ground voltage VSS and the power supply voltage VDD, respectively. Therefore, when the fuse state information signal FUSE_OUT is at the power supply voltage VDD, it indicates that the fuse F31 is cut.

Figure 4B:
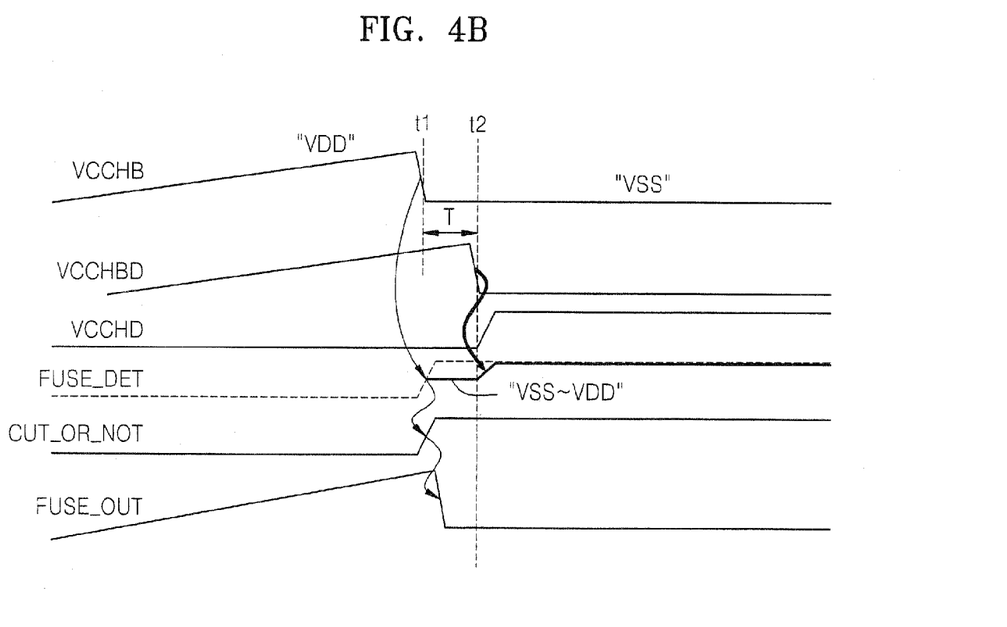
FIG. 4B is a diagram illustrating waveforms of the signals input to and/or output from the fuse circuit illustrated in FIG. 3 when a leakage current path exists through the fuse in the fuse circuit.

FIG. 4B is a diagram illustrating waveforms of the signals input to and/or output from the fuse circuit illustrated in FIG. 3 when there is a leakage current path through the fuse F31 generated by resistance components left over from cutting the fuse F31. Referring to FIG. 4B, if fuse residues remain after the fuse F31 is cut, resistance components may be formed due to the fuse residues, thereby generating a leakage current path through the fuse. In this case, as illustrated in FIG. 4B, the state information signal FUSE_DET may have a voltage between the ground voltage VSS and the power supply voltage VDD during the fuse cut detection time period T.

The inverter 131 of the latch circuit 331 recognizes the state information signal FUSE_DET, which is applied to the input node CUT_OR_NOT, as having the power supply voltage VDD. Therefore, the voltage of the input node CUT_OR_NOT is driven as high as the power supply voltage VDD, and the voltage of the fuse state information signal FUSE_OUT is driven as low as the ground voltage VSS. That is, when the voltage of the detection node at FUSE_DET is between the first and second power supply voltages VDD and VSS, the latch circuit 331 always recognizes the voltage of the detection node as a first fuse state level (fuse not cut) due to the regenerative action of the cross-connected inverters 131 and 132 which amplify and latch the voltage of the detection node. In contrast, when the fuse F31 is cut without a leakage path, the latch circuit recognizes the voltage of the detection node as a second fuse state (fuse cut).

According to the embodiment illustrated in FIG. 3, no matter what happens during the fuse cut detection time period T, the NMOS transistor N31 and the transmission gate TG are both turned off at the time t2 which follows the fuse cut detection time period T. Therefore, a leakage current path through which a current is discharged to the second power supply does not exist any longer, and the voltage of the state information signal FUSE_DET is driven as high as the power supply voltage VDD after the time t2.

As described above, according to the embodiment illustrated in FIG. 3, it is possible to eliminate a leakage current path generated due to fuse residues from a fuse circuit. Therefore, it is possible to prevent leakage current from flowing through such a leakage current path and thus prevent the fuse circuit from malfunctioning due to leakage current.

Figure 5:
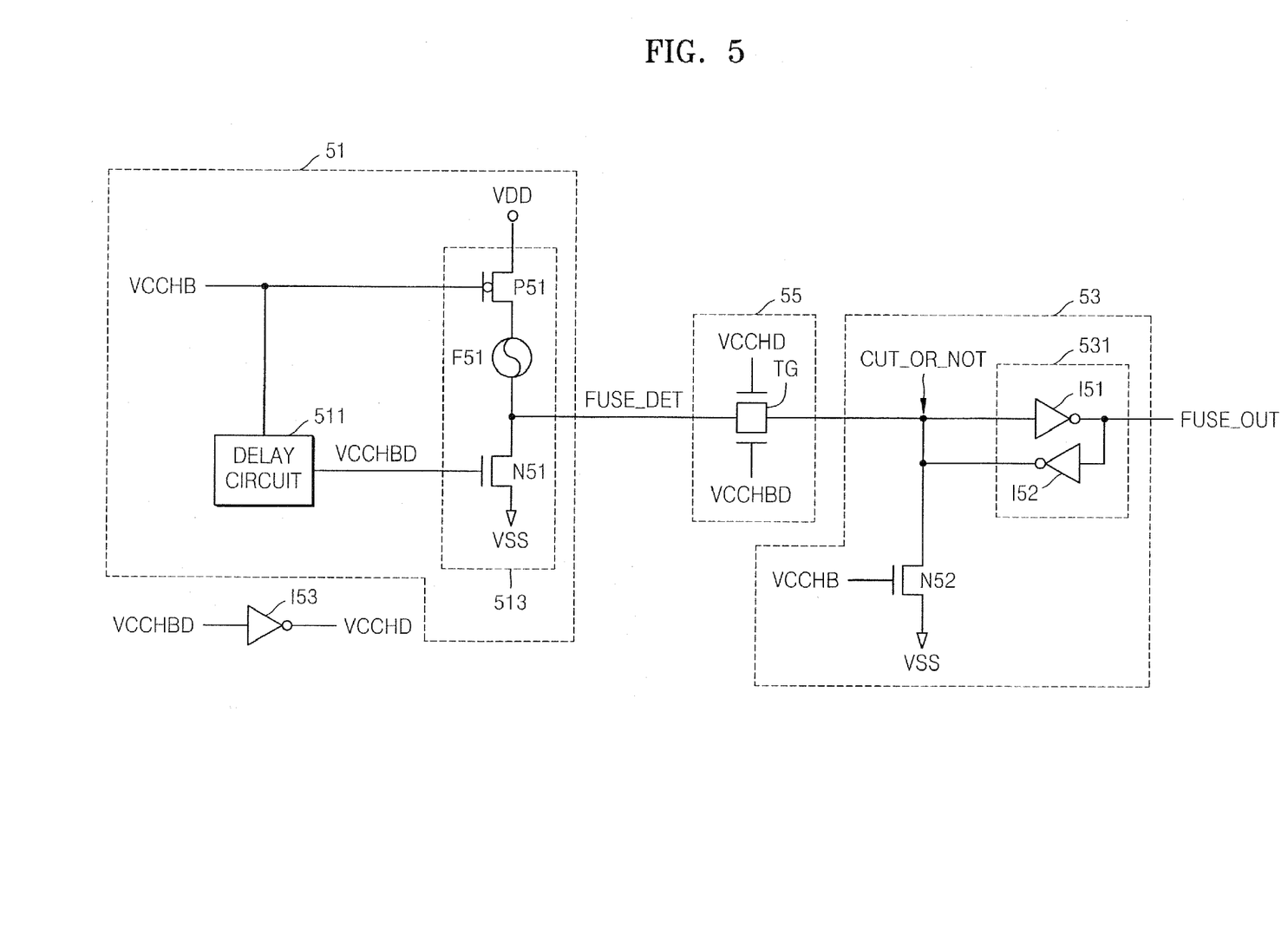
FIG. 5 is a circuit diagram of another embodiment of a fuse circuit according to some of the inventive principles of this patent disclosure.

FIG. 5 is a circuit diagram of another embodiment of a fuse circuit according to some additional principles of this patent disclosure. Referring to FIG. 5, the fuse circuit includes a fuse cut detection unit 51, a maintenance and output unit 53, and a connection/disconnection unit 55.

The maintenance and output unit 53 includes a latch circuit 531 having inverters 151 and 152, and an NMOS transistor N52. The connection/disconnection unit 55 includes a switch TG which includes a transmission gate. The structure of the maintenance and output unit 53 is the same as the structure of the maintenance and output unit 33 illustrated in FIG. 3, and the structure of the connection/disconnection unit 55 is the same as the structure of the connection/disconnection unit 35 illustrated in FIG. 3.

The fuse cut detection unit 51 includes a delay circuit 511 and a state information output unit 513. The structure of the delay circuit 511 is the same as the structure of the delay circuit 311 illustrated in FIG. 3, but the structure of the state information output unit 513 is different from the structure of the state information output unit 313 illustrated in FIG. 3.

The state information output unit 513 includes a fuse F51, a PMOS transistor P51, and an NMOS transistor N51. The PMOS transistor P51 is connected between a first power supply providing a voltage VDD and a first terminal of the fuse F51, and has a gate to which a first control signal VCCHB is applied. The NMOS transistor N51 is connected between a second terminal of the fuse F51 and a second power supply providing a ground voltage VSS, and has a gate to which a second control signal VCCHBD output from the delay circuit 511 is applied.

The operation of the fuse circuit illustrated in FIG. 5 is much the same as the operation of the fuse circuit illustrated in FIG. 3, however, the fuse F51 is located in an alternative arrangement. Thus, a detailed description of the operation of the fuse circuit illustrated in FIG. 5 will be skipped.

As described above, embodiments of fuse circuits according to the inventive principles may eliminate a leakage current path which is generated due to fuse residues remaining after a fuse is cut. Therefore, it may be possible to reduce the amount of leakage current generated due to a leakage current path and to prevent the fuse circuit from malfunctioning due to leakage current.

While the inventive principles have been shown and described with reference to exemplary embodiments thereof, it will be understood by those of ordinary skill in the art that various changes in form and details may be made therein without departing from the spirit and scope of the present invention as defined by the following claims.

The invention claimed is:

1. A fuse circuit comprising:
a fuse cut detection unit to output state information indicating whether or not a fuse is cut during a fuse cut detection time period;
a maintenance and output unit to maintain the state information and output a fuse state information signal; and
a connection/disconnection unit to connect the fuse cut detection unit to the maintenance and output unit during the fuse cut detection time period and disconnect the fuse cut detection unit from the maintenance and output unit after the fuse cut detection time period;
wherein the fuse cut detection unit comprises:
a first device to couple a detection node to a first power supply, and
a second device to couple the detection node to a second power supply through the fuse; and
wherein the first and second devices are both on at the same time during the fuse cut detection time period.

2. The fuse circuit of claim 1, wherein the fuse cut detection unit comprises:
the fuse having a first terminal connected to the second power supply;
a delay circuit to delay a first control signal by the fuse cut detection time period and output a second control signal as a result of the delay; and
a state information output unit to output the state information in response to the first control signal and the second control signal.

3. The fuse circuit of claim 2, wherein the connection/disconnection unit comprises a switch to connect the fuse cut detection unit to the maintenance and output unit or disconnect the fuse cut detection unit from the maintenance and output unit in response to the second control signal.

4. The fuse circuit of claim 1, wherein the fuse cut detection unit comprises:
a delay circuit to delay a first control signal by the fuse cut detection time period and output a second control signal as a result of the delay; and
a state information output unit including the fuse, and configured to output the state information in response to the first control signal and the second control signal.

5. The fuse circuit of claim 4, wherein the connection/disconnection unit comprises a switch to connect the fuse cut detection unit to the maintenance and output unit or disconnect the fuse cut detection unit from the maintenance and output unit in response to the second control signal.

6. The fuse circuit of claim 1, wherein the first device is much smaller than the second device.

7. A fuse circuit comprising:
a fuse cut detection unit to output state information indicating whether or not a fuse is cut during a fuse cut detection time period;
a maintenance and output unit to maintain the state information and output a fuse state information signal; and
a connection/disconnection unit to connect the fuse cut detection unit to the maintenance and output unit during the fuse cut detection time period and disconnect the fuse cut detection unit from the maintenance and output unit after the fuse cut detection time period;
wherein the fuse cut detection unit comprises:
the fuse having a first terminal connected to a first power supply;
a delay circuit to delay a first control signal by the fuse cut detection time period and output a second control signal as a result of the delay; and
a state information output unit to output the state information in response to the first control signal and the second control signal; and
wherein the state information output unit comprises:
a first MOS transistor connected between a second terminal of the fuse and a node from which the state information is output, and having a gate to which the first control signal is applied; and
a second MOS transistor connected between the node from which the state information is output and a second power supply, and having a gate to which the second control signal is applied.

8. The fuse circuit of claim 7, wherein:
the first power supply provides a power supply voltage, the second power supply provides a ground voltage;
the first control signal ramps up to a predetermined voltage by following the power supply voltage; and
once the first control signal reaches the predetermined voltage, the voltage of the first control signal is driven as low as the ground voltage.

9. The fuse circuit of claim 7, wherein the maintenance and output unit comprises:

a latch circuit having an input terminal connected to the connection/disconnection unit and an output terminal from which the fuse state information signal is output; and a third MOS transistor connected between the input terminal of the latch circuit and the second power supply, and having a gate to which the first control signal is applied.

10. A fuse circuit comprising:
a fuse cut detection unit to output state information indicating whether or not a fuse is cut during a fuse cut detection time period;
a maintenance and output unit to maintain the state information and output a fuse state information signal; and
a connection/disconnection unit to connect the fuse cut detection unit to the maintenance and output unit during the fuse cut detection time period and disconnect the fuse cut detection unit from the maintenance and output unit after the fuse cut detection time period;
wherein the fuse cut detection unit comprises:
a delay circuit to delay a first control signal by the fuse cut detection time period and output a second control signal as a result of the delay; and
a state information output unit including the fuse, and configured to output the state information in response to the first control signal and the second control signal;
wherein the state information output unit comprises:
the fuse;
a first MOS transistor connected between a first power supply and a first terminal of the fuse, and having a gate to which the first control signal is applied; and
a second MOS transistor connected between a second terminal of the fuse and a second power supply, and having a gate to which the second control signal is applied; and
wherein the state information is output from a connection node between the second terminal of the fuse and the second MOS transistor.

11. The fuse circuit of claim 10, wherein:
the first power supply provides a power supply voltage, the second power supply provides a ground voltage;
the first control signal gradually ramps up to a predetermined voltage by following the power supply voltage; and
once the first control signal reaches the predetermined voltage, the level of the first control signal is driven to the ground voltage.

12. The fuse circuit of claim 10, wherein the maintenance and output unit comprises:
a latch circuit having an input terminal connected to the connection/disconnection unit, and an output terminal from which the fuse state information signal is output; and
a third MOS transistor connected between the input terminal of the Latch circuit and the second power supply, and having a gate to which the first control signal is applied.

13. A fuse circuit comprising:
a delay circuit to delay a first control signal by a predetermined time period and output a second control signal as a result of the delay;

a state information output unit to output state information indicating whether or not a fuse is cut in response to the first control signal and the second control signal;
a maintenance and output unit to maintain the state information and output a fuse state information signal; and
a connection/disconnection unit to disconnect the state information output unit from the maintenance and output unit in response to the second control signal;
wherein the state information output unit comprises:
a first device to couple a detection node to a first power supply, and
a second device to couple the detection node to a second power supply through the fuse; and
wherein the first and second devices are both on at the same time during the predetermined time period.

14. The fuse circuit of claim 13, wherein the state information output unit detects the state information during the predetermined time period and outputs the detected state information.

15. The fuse circuit of claim 13, wherein the connection/disconnection unit connects the state information output unit to the maintenance and output unit during the predetermined time period and disconnects the state information output unit from the maintenance and output unit outside the predetermined time period.

16. The fuse circuit of claim 13, wherein the first device is much smaller than the second device.

17. A method of sensing the state of a fuse, the method comprising:
connecting a detection node to a first power supply through a first device;
connecting the detection node to a second power supply through the fuse and a second device;
detecting a voltage of the detection node; and
always recognizing the voltage of the detection node as a predetermined fuse state when the voltage of the detection node is between voltages of the first and second power supply;
wherein the first and second devices are both on at the same time during a fuse cut detection time period.

18. The method of claim 17 wherein detecting the voltage of the detection node comprises amplifying the voltage of the detection node.

19. The method of claim 17 wherein detecting the voltage of the detection node comprises connecting the detection node to a latch circuit.

20. The method of claim 19 further comprising disconnecting the detection node from the latch circuit after a fuse cut detection time period.

21. The method of claim 17 further comprising disconnecting the detection node from the first power supply voltage after the fuse cut detection time period.

22. The method of claim 17 wherein:
the first device comprises a transistor having a first size; and
the second device comprises a transistor having a second size substantially greater than the first size.

23. The fuse circuit of claim 17, wherein the second size is much greater than the first size.

* * * * *

UNITED STATES PATENT AND TRADEMARK OFFICE
CERTIFICATE OF CORRECTION

PATENT NO.         : 7,459,957 B2                                          Page 1 of 1
APPLICATION NO.    : 11/565838
DATED              : December 2, 2008
INVENTOR(S)        : Min-Soo Kim et al.

It is certified that error appears in the above-identified patent and that said Letters Patent is hereby corrected as shown below:

Column 4, line 65, the word "133" should read -- I33 --;
Column 5, line 3, the words "131 and 132" should read -- I31 and I32 --;
Column 5, line 26, the word "133" should read -- I33 --;
Column 6, line 33, the word "131" should read -- I31 --;
Column 6, lines 44-45, the words "131 and 132" should read -- I31 and I32 --;
Column 7, line 4, the words "151 and 152" should read -- I51 and I52 --;
Column 9, line 55, the word "Latch" should read -- latch --.

Signed and Sealed this

Twenty-fourth Day of March, 2009

JOHN DOLL
*Acting Director of the United States Patent and Trademark Office*